(12) United States Patent
Cheng et al.

(10) Patent No.: US 7,935,998 B2
(45) Date of Patent: May 3, 2011

(54) SELF-ALIGNED BODY CONTACT FOR A SEMICONDUCTOR-ON-INSULATOR TRENCH DEVICE AND METHOD OF FABRICATING SAME

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 622 days.

(21) Appl. No.: 12/053,692

(22) Filed: Mar. 24, 2008

(65) Prior Publication Data

US 2008/0169494 A1 Jul. 17, 2008

Related U.S. Application Data

(62) Division of application No. 11/308,542, filed on Apr. 4, 2006, now Pat. No. 7,439,135.

(51) Int. Cl.
*H01L 23/02* (2006.01)

(52) U.S. Cl. ........ 257/296; 257/302; 257/303; 257/341; 257/342; 257/E21.396; 257/E21.648; 257/E21.657; 257/E27.096; 257/E27.112; 257/E29.279

(58) Field of Classification Search .......... 257/296–303, 257/341–342, E21.372, 396, 648–657, 27.092–27.096, 257/112, 29.279
See application file for complete search history.

(56) References Cited

U.S. PATENT DOCUMENTS

| | | | |
|---|---|---|---|
| 4,916,083 A | | 4/1990 | Monkowski et al. |
| 5,362,663 A * | | 11/1994 | Bronner et al. ............... 438/241 |
| 5,606,188 A | | 2/1997 | Bronner et al. |
| 5,723,370 A * | | 3/1998 | Ning et al. ................... 438/156 |
| 5,770,484 A * | | 6/1998 | Kleinhenz ..................... 438/155 |
| 5,929,477 A * | | 7/1999 | McAllister Burns et al. 257/306 |
| 5,998,837 A * | | 12/1999 | Williams ...................... 257/341 |
| 6,137,129 A * | | 10/2000 | Bertin et al. .................. 257/302 |
| 6,252,267 B1 | | 6/2001 | Noble, Jr. |
| 6,339,239 B1 * | | 1/2002 | Alsmeier et al. ............. 257/296 |
| 6,426,252 B1 * | | 7/2002 | Radens et al. ................ 438/243 |
| 6,429,477 B1 | | 8/2002 | Mandelman et al. |

(Continued)

OTHER PUBLICATIONS

PCT Notification of Transmittal of the International Search Report and the Written Opinion of the International Searching Authority; Date of Mailing Sep. 9, 2008; International application No. PCT/US07/64380; International filing date Mar. 20, 2007; 11 pages.

(Continued)

*Primary Examiner* — Michael S Lebentritt
(74) *Attorney, Agent, or Firm* — Schmeiser, Olsen & Watts; Daniel Schnurmann

(57) ABSTRACT

A structure and method of forming a body contact for a semiconductor-on-insulator trench device. The method including: forming set of mandrels on a top surface of a substrate, each mandrel of the set of mandrels arranged on a different corner of a polygon and extending above the top surface of the substrate, a number of mandrels in the set of mandrels equal to a number of corners of the polygon; forming sidewall spacers on sidewalls of each mandrel of the set of mandrels, sidewalls spacers of each adjacent pair of mandrels merging with each other and forming a unbroken wall defining an opening in an interior region of the polygon, a region of the substrate exposed in the opening; etching a contact trench in the substrate in the opening; and filling the contact trench with an electrically conductive material to form the contact.

10 Claims, 18 Drawing Sheets

U.S. PATENT DOCUMENTS

| | | | |
|---|---|---|---|
| 6,534,376 B2 * | 3/2003 | Tews .............................. | 438/386 |
| 6,534,824 B1 * | 3/2003 | Mandelman et al. ......... | 257/331 |
| 6,566,177 B1 | 5/2003 | Radens et al. | |
| 6,593,177 B2 | 7/2003 | Lee et al. | |
| 6,759,702 B2 | 7/2004 | Radens et al. | |
| 6,838,334 B1 * | 1/2005 | Gluschenkov et al. ....... | 438/243 |
| 7,170,126 B2 * | 1/2007 | Cheng et al. .................. | 257/302 |
| 7,485,525 B2 * | 2/2009 | Cheng et al. .................. | 438/242 |
| 2007/0059891 A1 | 3/2007 | Furukawa et al. | |
| 2007/0059895 A1 | 3/2007 | Im et al. | |

OTHER PUBLICATIONS

Notice of Allowance (Mail Date Jun. 16, 2008) for U.S. Appl. No. 11/308,542, Filing Date Apr. 4, 2006.

International Search Report, Sep. 9, 2008.

* cited by examiner

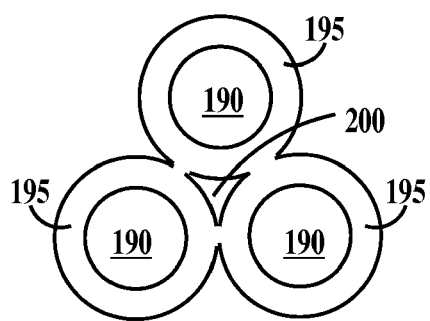
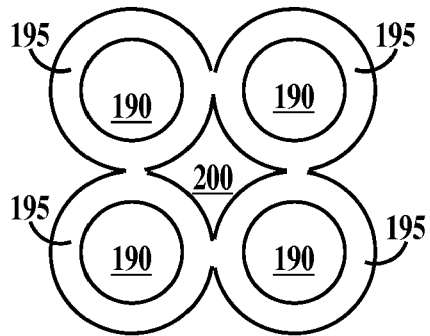
*FIG. 18A*  *FIG. 18B*
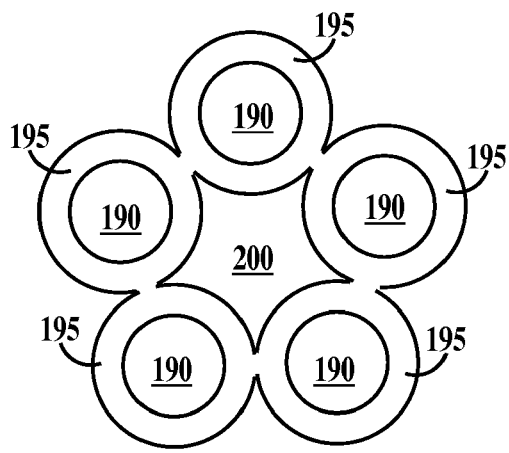
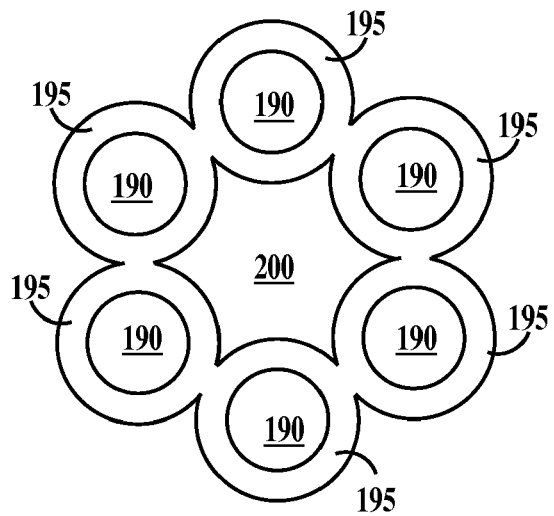
*FIG. 18C*  *FIG. 18D*
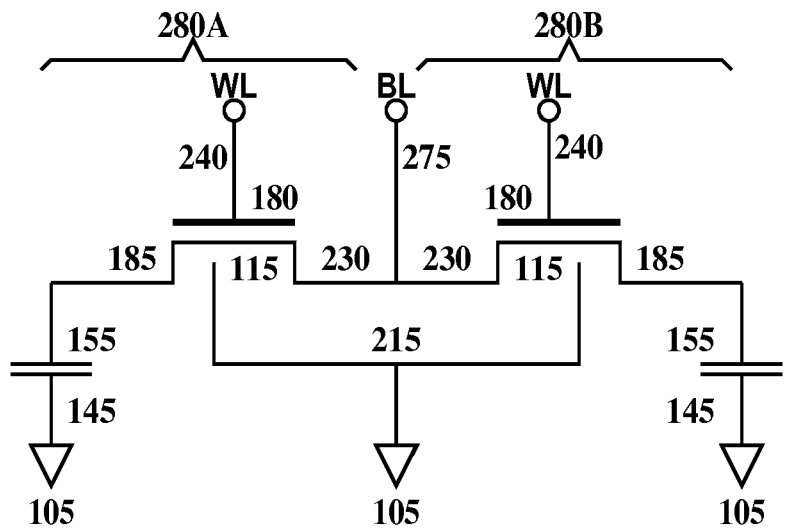
*FIG. 19*

SELF-ALIGNED BODY CONTACT FOR A SEMICONDUCTOR-ON-INSULATOR TRENCH DEVICE AND METHOD OF FABRICATING SAME

This application is a division of U.S. patent application Ser. No. 11/308,542 filed on Apr. 4, 2006 now U.S. Pat. No. 7,439,135.

FIELD OF THE INVENTION

The present invention generally relates to semiconductor transistor structures and methods of fabricating semiconductor transistor structures; more specifically the present invention relates to a structure for a contacted-body semiconductor-on-insulator (SOI) vertical metal-oxide-silicon field effect transistor (vertical MOSFET) and methods for fabricating SOI vertical MOSFETs.

BACKGROUND OF THE INVENTION

Vertical MOSFETs formed in SOI substrates allow to continue scaling devices because the channel length of a vertical MOSFET is independent of the minimum lithographic feature size. However, without body contacts vertical MOSFETs have floating bodies (wells) which can cause unwanted charge storage in the body leading to signal leakage, bipolar conduction and snapback. Current structures and methods for forming body contacts require precise alignment of the photolithographic masks that define the body contact and are time-consuming and expensive. Therefore, there is a need for a structure for a contacted-body SOI vertical MOSFET and less costly and time consuming fabrication methods of contacted-body SOI vertical MOSFETs.

SUMMARY OF THE INVENTION

A first aspect of the present invention is a method of forming a contact; comprising: forming set of mandrels on a top surface of a substrate, each mandrel of the set of mandrels arranged on a different corner of a polygon and extending above the top surface of the substrate, a number of mandrels in the set of mandrels equal to a number of corners of the polygon; forming sidewall spacers on sidewalls of each mandrel of the set of mandrels, sidewalls spacers of each adjacent pair of mandrels merging with each other and forming a unbroken wall defining an opening in an interior region of the polygon, a region of the substrate exposed in the opening; etching a contact trench in the substrate in the opening; and filling the contact trench with an electrically conductive material to form the contact.

A second aspect of the present invention is a method of forming a dynamic access memory cell, comprising: forming a pad layer on a top surface of a semiconductor-on-insulator substrate, the substrate including a buried insulating layer separating the substrate into an upper semiconductor layer between a top surface of the buried insulating layer and the top surface of substrate and a lower semiconductor layer; forming a set of device trenches, each device trench extending from a top surface of the pad layer, through the upper semiconductor layer, through the buried insulating layer and into the lower semiconductor layer; forming a dielectric layer on sidewalls of the device trenches and filling the device trenches with an electrically conductive first fill material to a level below the a top surface of the buried insulating layer to form a trench capacitor; forming a buried electrically conductive strap around each of the devices trenches in the buried insulating layer and forming sources or drains in the upper semiconductor layer adjacent to the buried strap; forming a first insulating cap over the first fill material; forming a gate dielectric on sidewalls of the device trenches above the first fill material; filling the device trenches with an electrically conductive second fill material to form vertical gates; removing the pad layer to expose mandrels comprising regions of the vertical gates extending above the top surface of the substrate; forming sidewall spacers on sidewalls of the mandrels, the sidewall spacers merging with each other and forming an unbroken ring around a region of the substrate; etching a contact trench through the upper semiconductor layer, the buried insulating layer and into the lower semiconductor layer in the region of the substrate not covered by the sidewall spacers; filling the contact trench with an electrically conductive third fill material and recessing the third fill material below the top surface of the substrate but above the top surface of the buried insulating layer; forming in the contact trench, a second insulating cap over the third fill material and forming an electrically conductive cap over the second insulating cap; and removing the sidewall spacers and forming sources or drains in the upper semiconductor layer around the device trenches adjacent to the top surface of the upper semiconductor layer.

A third aspect of the present invention is an electronic device, comprising: a semiconductor on insulator substrate, the substrate including a buried insulating layer separating the substrate into an upper semiconductor layer between a top surface of the buried insulating layer and the top surface of substrate and a lower semiconductor layer; at least three vertical field effect transistors (FETs), each of the three or more FETs having a body formed in the upper semiconductor layer, a gate extending from the top surface of the substrate into the upper semiconductor layer, a first source/drain formed around the gate adjacent to the top surface of the upper semiconductor layer and a second source drain formed around the gate adjacent to the buried insulating layer; and a buried body contact formed in the substrate between the at least three vertical FETs, the body contact self-aligned to all of the gates of the at least three vertical FETs, the body contact extending above and below the buried insulating layer and electrically connecting the upper semiconductor layer to the lower semiconductor layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 7B is a top view illustrating the section line 7A-7A through which FIG. 7A is taken;

FIGS. 8A, 9A, 10A, 11A, 12A 13A, 14A, 15A and 16A are taken;

FIG. 17A is a cross-sectional view illustrating formation of a bitline contact and FIG. 17B is a top view illustrating the section line 17A-17A through which FIG. 17A is taken according to embodiments of the present invention;

FIGS. 18A, 18B, 18C and 18D illustrated additional mandrel layouts according to embodiments of the present invention; and FIG. 19 is a schematic circuit diagram illustrating the relationship between the physical structures of FIGS. 17A and 17B and a DRAM circuit.

DETAILED DESCRIPTION OF THE INVENTION

For the purposes of describing and claiming the present invention, the term self-aligned is defined as locating and forming a structure of a semiconductor device relative to other structures of the semiconductor device by use of existing semiconductor structures to define the edges and lateral (horizontal) extent of the self-aligned structure and not by edges defined by a photolithographic mask.

For the purposes of describing and claiming the present invention, a four-sided diamond pattern is defined as a figure with four equal or unequal sides forming two inner and opposite obtuse angles and two inner and opposite acute angles.

For the purposes of describing and claiming the present invention, the term polygon is defined to be a multisided figure, of at least three sides that may or may not all be equal in length.

While the structure and method of fabricating the structure may be used to fabricate a body contact to an array of vertical MOSFETs, the embodiments of the present invention will be illustrated using the example of a memory array that includes an array of memory devices arranged in a regular repeating pattern. Each memory device includes a vertical N-channel field effect transistor (vertical NFET) and a storage node. Each storage node is a trench capacitor. The memory array is fabricated in an SOI substrate and the embodiments of the present invention provide a method and structure for a self-aligned body contact to the P-wells of the vertical NFETs.

Also, while the detailed description is described in term of an SOI substrate comprised of silicon-on-silicon oxide-on silicon, any the silicon layers may be replaced by layers of other semiconductor material known in the art and the oxide layer by other insulators known in the art. Likewise, the various polysilicon layers may be replaced by other semiconductor or electrically conducting materials known in the art.

Figure 1:
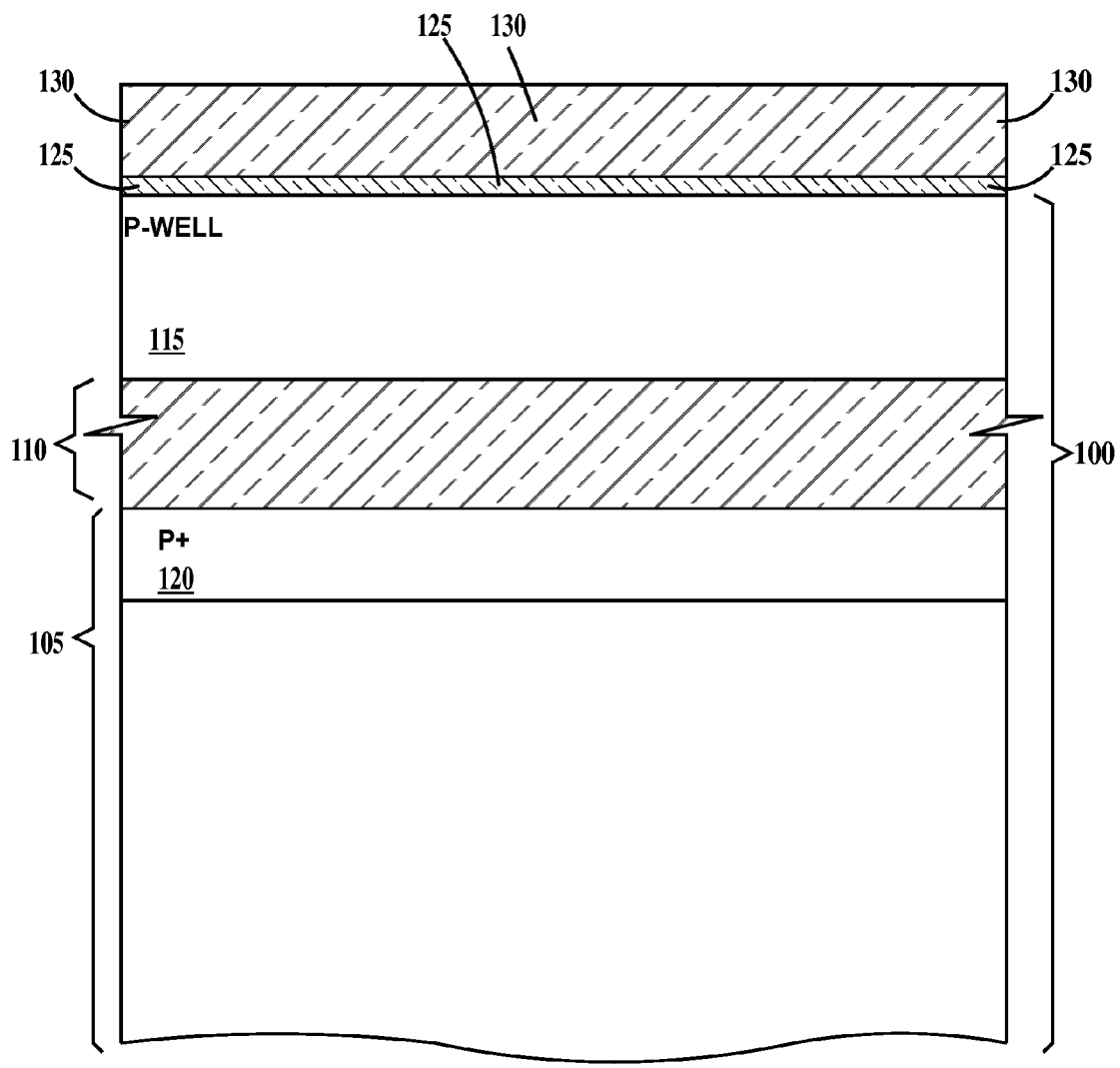
FIGS. 1 through 6 and 7A are cross-sectional views illustrating fabrication of a DRAM storage cell prior to formation of a body contact to the vertical NFET of the storage cell according to embodiments of the present invention.

FIGS. 1 through 6 and 7A are cross-sectional views illustrating fabrication of a DRAM storage cell prior to formation of a body contact to the vertical NFET of the storage cell according to embodiments of the present invention. In FIG. 1, an SOI substrate 100 comprises a lower silicon layer 105, a buried oxide layer (BOX) 110 on top of the silicon substrate and an upper silicon layer 115 on top of the BOX. Upper silicon layer 115 is doped P-type and will serve as the P-well of the vertical NFET. Formed in an upper portion of silicon layer 105 adjacent to BOX layer 110 is a P-type silicon layer 120. Formed on top of upper silicon layer 115 is a pad oxide layer 125 comprising silicon dioxide and formed on top of the pad oxide layer is a pad nitride layer 130. In one example, P-type silicon layer 120 is formed by ion implantation. In one example, pad oxide layer 125 is formed by thermal oxidation of a top surface of upper silicon layer 115 and pad nitride layer 130 is formed by low pressure chemical vapor deposition (LPCVD) of silicon nitride. In one example, upper silicon layer 115 has a thickness between about 25 nm and about 1000 nm, BOX layer 110 has a thickness between about 10 nm and about 500 nm, P-type silicon layer 120 has a thickness between about 25 nm to about 100 nm, pad oxide layer has a thickness of between about 2 nm to about 10 nm and pad nitride layer 130 has a thickness between about 100 nm and about 2000 nm.

Figure 2:
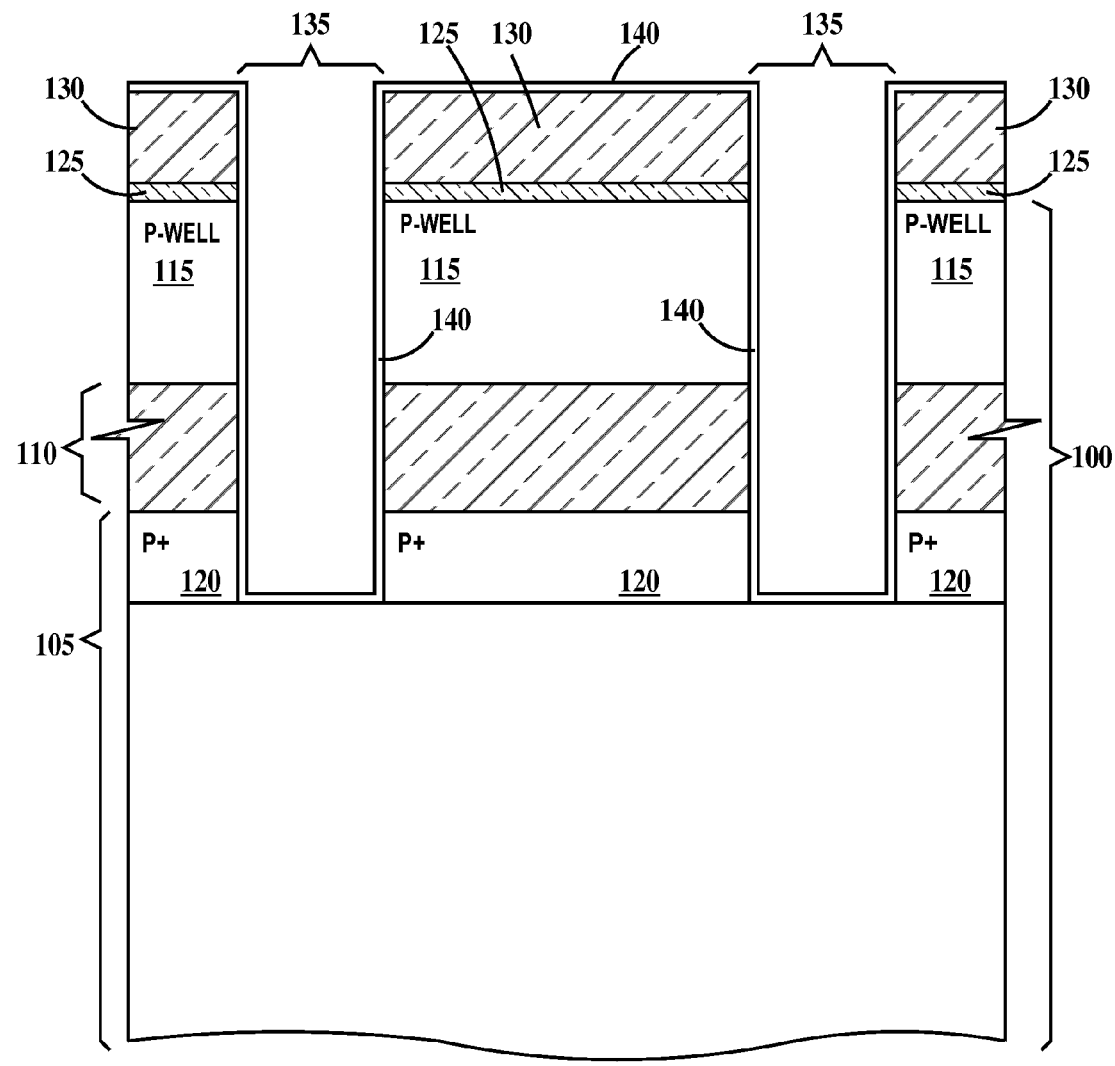

In FIG. 2, trenches 135 are etched from a top surface of pad nitride 130, through pad oxide layer 125, upper silicon layer 115, through BOX layer 110 and through P-type layer 120 and an optional conformal diffusion barrier 140 formed on the sidewalls and bottom of the trenches. In one example, trenches 135 are formed by a photolithographic process (using an optional hard mask) and a reaction ion etch (RIE) process. In one example, conformal diffusion barrier 140 is silicon nitride formed by LPCVD.

Figure 3:
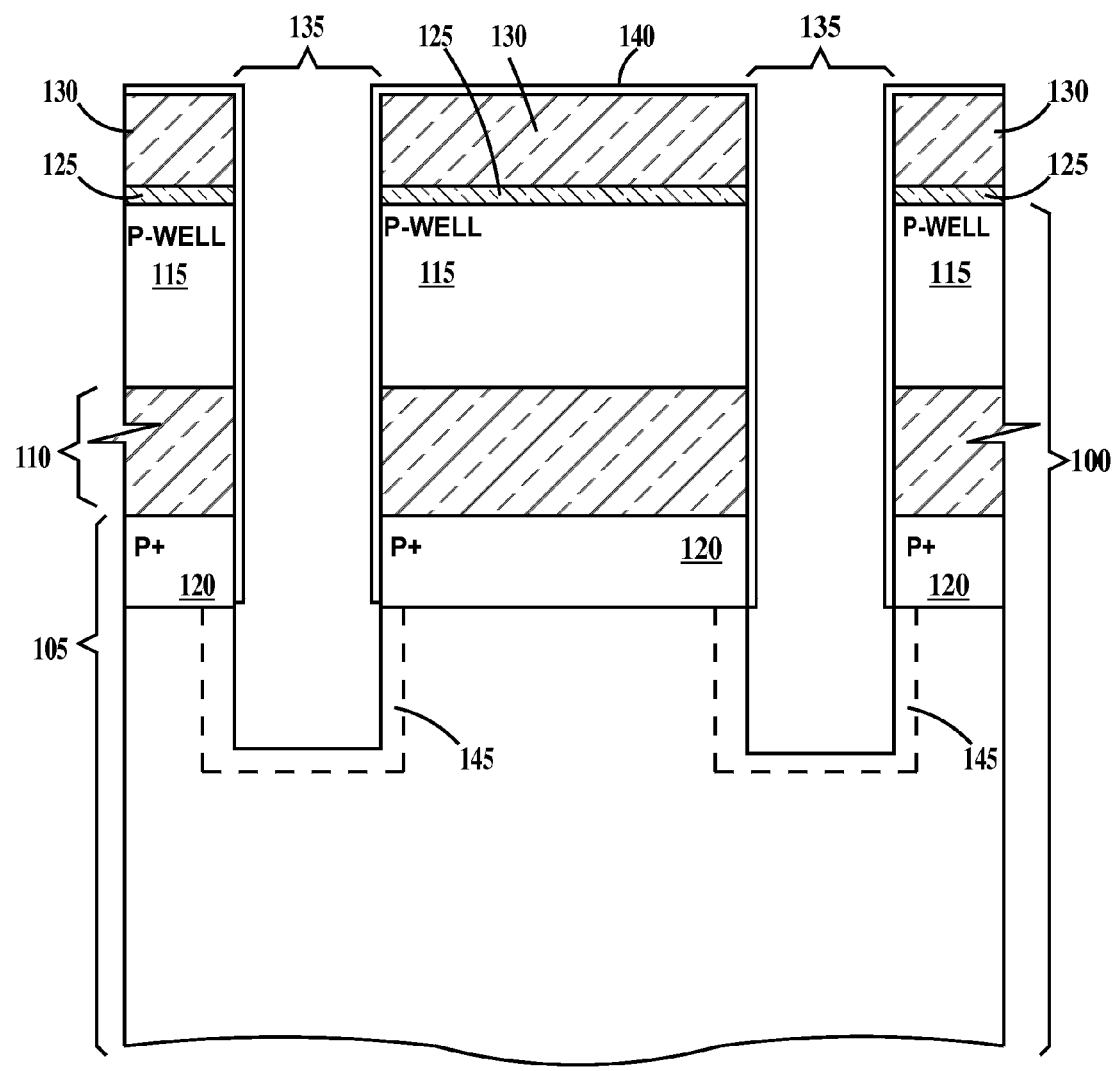

In FIG. 3, trenches 135 are extended into lower silicon layer 105 below P-type layer 120, which also removes the diffusion barrier that was on the bottom of the trenches in FIG. 2. N-type buried plates 145 are formed, for example, by gas phase doping. In one example, trenches 135 have a full depth of between about 3 micron and about 10 microns. In one example, N-type buried plates 145 have an N-type doping concentration of between about 1E18 atm/cm$^3$ and about 1E20 atm/cm$^3$. N-type buried plates 145 will form first plates of the trench capacitors.

Figure 4:
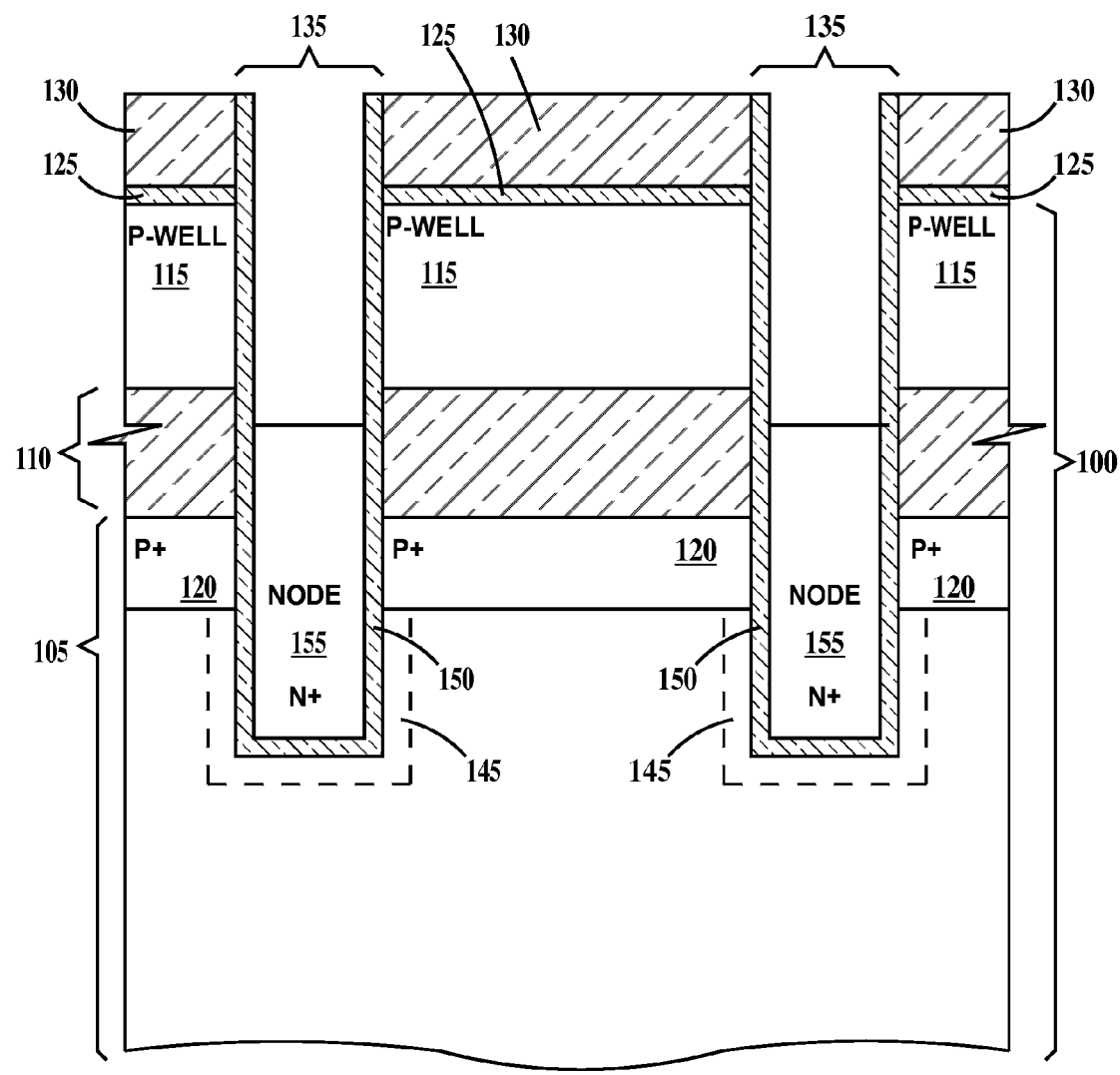

In FIG. 4, diffusion barrier 140 (see FIG. 3) is removed and a conformal node dielectric layer 150 is formed on the sidewalls and bottoms of trenches 135. In one example, node dielectric layer 150 is formed by LPCVD deposition of silicon nitride and is between about 25 angstroms and about 60 angstroms thick followed by an optional thermal oxidation. Then electrically conducting nodes 155 are formed. In one example, conducting nodes 155 are formed by filling trenches 135 with an LPCVD deposition of N-doped polysilicon, optionally performing a chemical mechanical polish (CMP) to planarize the N-doped polysilicon to the top surface of pad nitride layer 130 and then performing a recess RIE to recess the N-doped polysilicon beneath upper silicon layer 115 but within BOX layer 110. Node dielectric layer 150 forms the dielectric layer of the trench capacitors and conducting nodes 155 form second plates of the trench capacitors.

Figure 5:
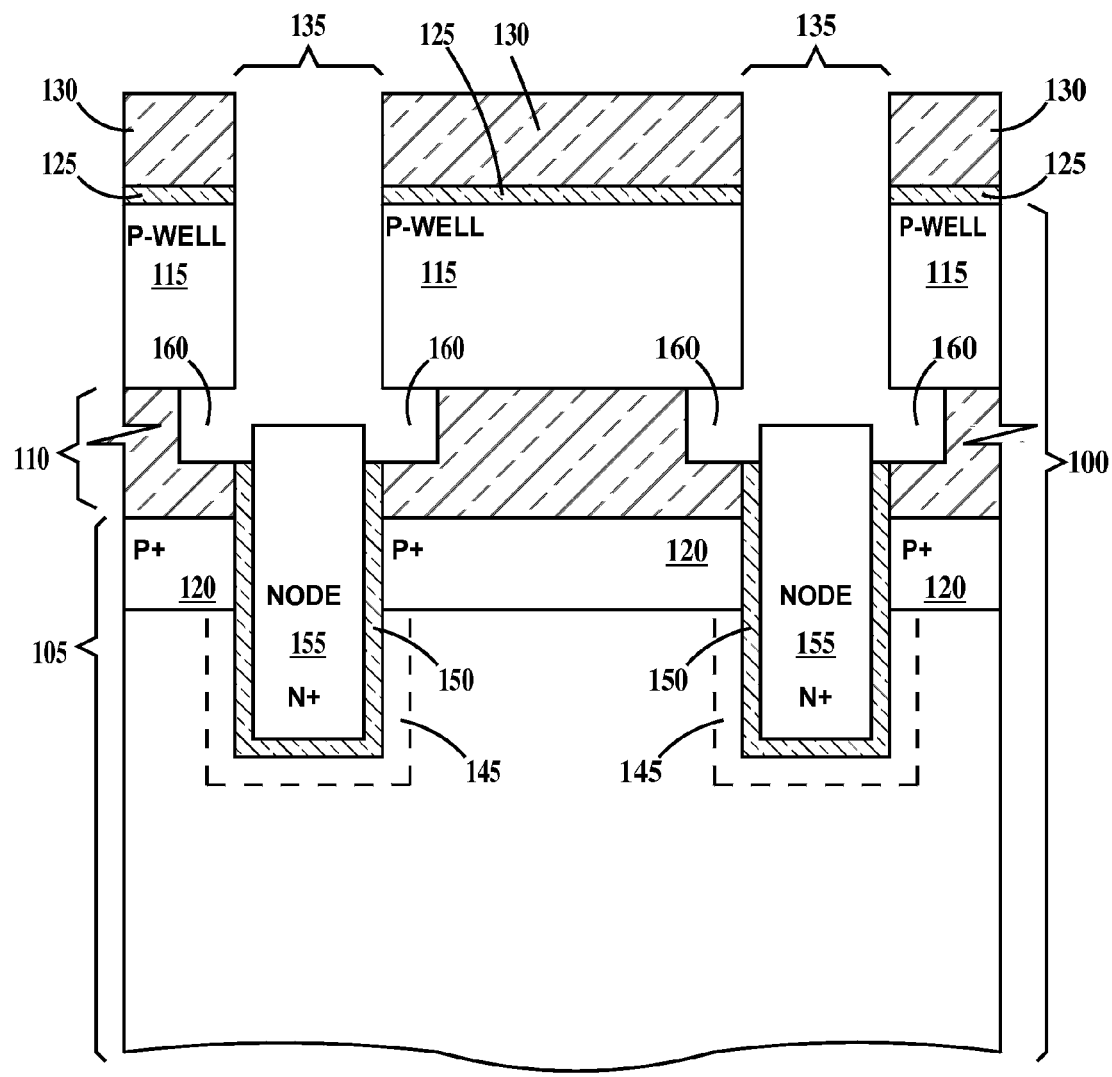

In FIG. 5, node dielectric layer 150 is removed from trenches 135 where the node dielectric is not protected by polysilicon nodes 155 and recesses 160 formed the edges of BOX layer 110 not protected by node dielectric layer 150. In one example, node dielectric 150 is removed by wet etching with an etchant of hydrofluoric acid mixed with ethylene glycol. In one example, recesses 160 are formed by wet etching with hydrofluoric acid.

Figure 6:
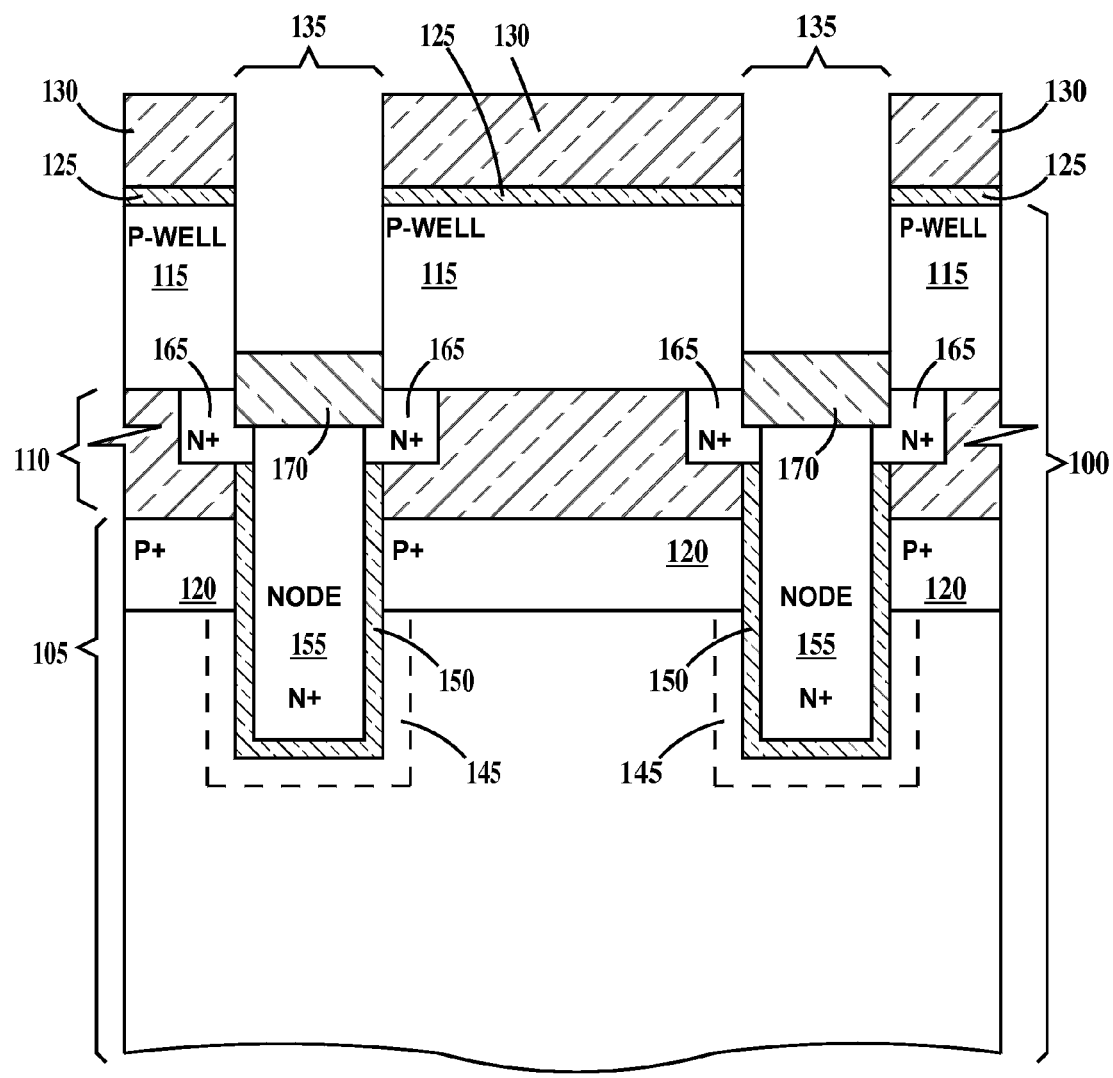

In FIG. 6, recesses 160 (see FIG. 5) are filled with N-type polysilicon to form buried straps 165. In one example, buried straps 165 are formed using LPCVD to deposit a thickness of N-doped polysilicon sufficient to fill recesses 160 (see FIG. 5) and excess strap material removed by a wet or plasma etch. Next dielectric caps 170 are formed. Dielectric caps 170 extend above and below the interface between BOX layer 110 and upper silicon layer 115. In one example, dielectric caps 170 are silicon dioxide formed by a high density plasma (HDP) process. HDP has a deposition rate greater on horizontal surfaces than along vertical surfaces such as the sidewalls of trenches 135. The dielectric material is then removed from sidewalls of trenches 135, leaving dielectric caps 170.

Figure 7A:
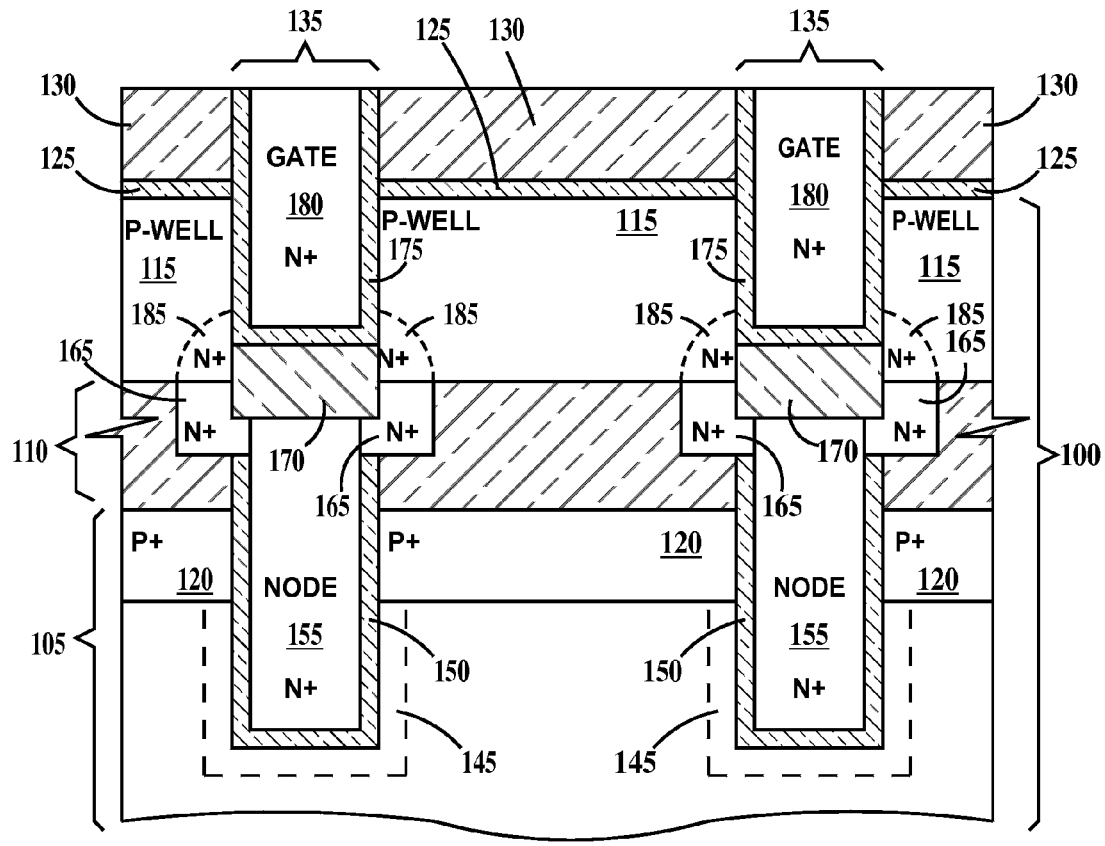

In FIG. 7A, gate dielectric layers 175 are formed on the sidewalls of trenches 135 and exposed surface of dielectric caps 170. Then an N-type polysilicon gate 180 is formed to fill up the remaining portions of trenches 135. In one example, gate dielectric layers 175 are formed by atomic layer deposition (ALD) or thermal oxidation and are between about 2 nm and about 20 nm thick. In one example, polysilicon gates 180 are formed by filling trenches 135 with an LPCVD deposition of N-doped polysilicon and optionally performing a CMP to planarize the N-doped polysilicon to the top surface of pad nitride layer 130. Sources 185 are formed in upper silicon layer 115 adjacent to buried straps 165 by out-diffusion of dopant atoms into the silicon layer from the buried straps during the various heat cycles of the fabrication processes. Gates 180 and form the gates of the vertical NFETs and sources 185 form the sources of the vertical NFETs.

Dielectric caps 170 electrically isolate polysilicon gates 180 from polysilicon nodes 155. Buried straps 165 are in direct physical and electrical contact with polysilicon nodes 155 and sources 185.

Figure 7B:
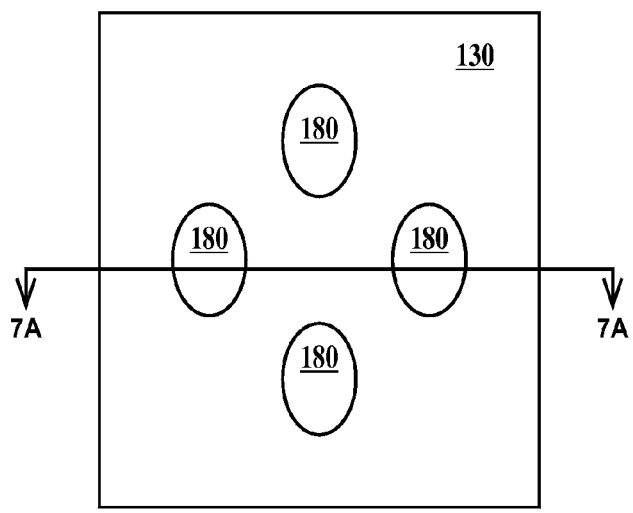

FIG. 7B is a top view illustrating the section line 7A-7A through which FIG. 7A is taken. In FIG. 7B, the layout plan of the gates of four NFETs of four DRAM cells is illustrated. Gate dielectric layers 175 are not illustrated in FIG. 7B. Four DRAM cells are located at the four corners of an equal length four sided diamond pattern. This group of four cells may be repeated to form a larger DRAM array by shifting copies of the leftmost three cells to the left by two cell positions, by shifting copies of the rightmost three cells to the right by two cell positions, by shifting copies of the topmost three cells to the top by two cell positions and by shifting copies of the bottommost three cells to the bottom by two cell positions as often as required.

FIGS. 8A, 9A, 10A, 11A, 12A 13A, 14A, 15A and 16A are cross-sectional views illustrating fabrication of the body contact to the vertical NFET of the storage cell DRAM storage according to embodiments of the present invention and FIGS. 8B, 9B, 10B, 11B, 12B, 13B, 14B, 15B and 16B are top views illustrating respective section lines 8A-8A, 9A-9A, 10A-10A, 11A-11A, 12A-12A, 13A-13A, 14A-14A, 15A-15A and 16A-16A of though which respective FIGS. 8A, 9A, 10A, 11A, 12A 13A, 14A, 15A and 16A are taken.

Figure 8A:
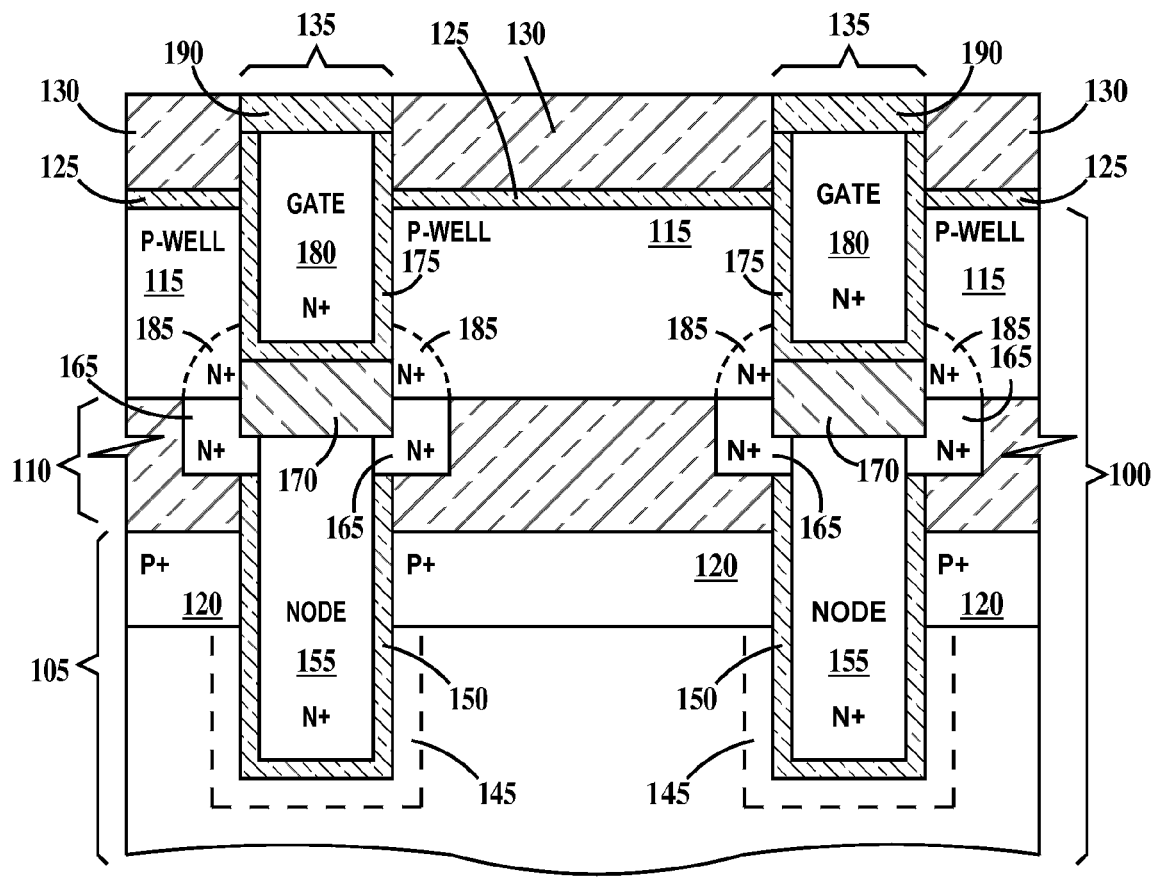
FIGS. 8A, 9A, 10A, 11A, 12A 13A, 14A, 15A and 16A are cross-sectional views illustrating fabrication of the body contact to the vertical NFET of the storage cell DRAM storage according to embodiments of the present invention
Figure 8B:
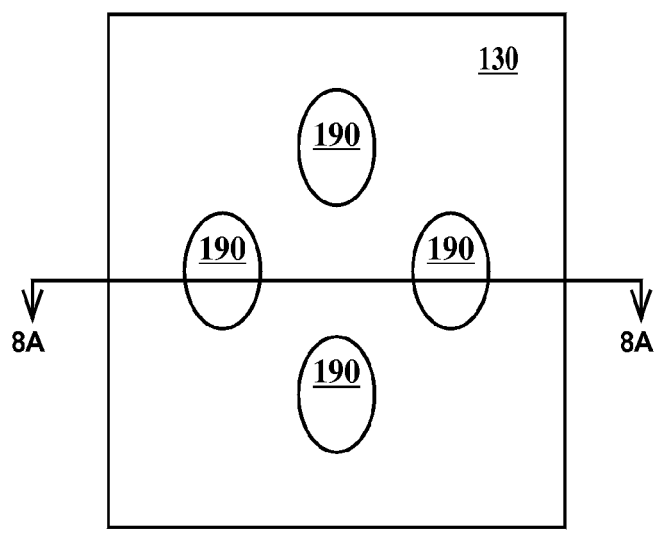
FIGS. 8B, 9B, 10B, 11B, 12B, 13B, 14B, 15B and 16B are top views illustrating respective section lines 8A-8A, 9A-9A, 10A-10A, 11A-11A, 12A-12A, 13A-13A, 14A-14A, 15A-15A and 16A-16A of though which respective

In FIG. 8A, upper regions of polysilicon gates 180 and optionally gate dielectric layer 175 are removed, for example by an RIE recess process and a etch stop layer 190 formed in the recess created. Etch stop layer 190 is advantageously chosen to be highly resistant to the etch processes described infra in relation to FIG. 9A. In one example, etch stop layer 190 comprises SiCOH (also known methyl doped silica, $SiO_x$ $(CH_3)_y$, $SiC_xO_yH_y$ and Black Diamond™, manufactured by Applied Materials, Santa Clara, Calif.). In one example, etch stop layer 190 is formed by spin application of SiCOH and curing followed by a CMP to co-planarize the top surfaces of pad nitride layer 130 and etch stop layer 190.

Figure 9A:
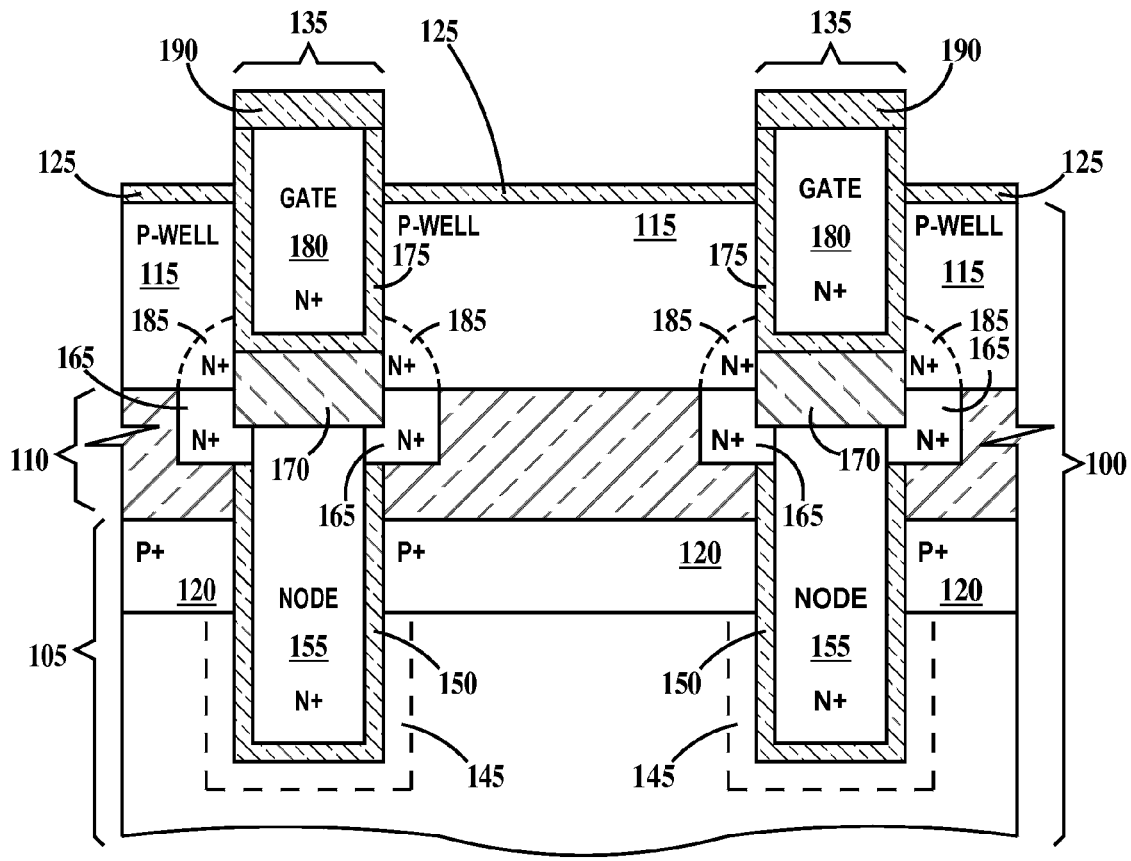
Figure 9B:
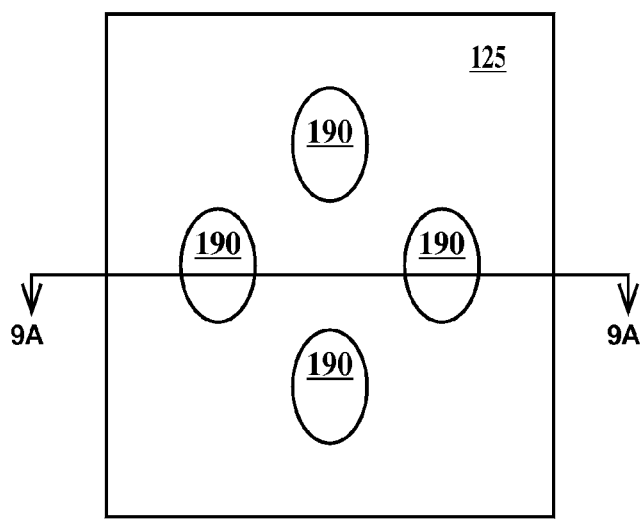

In FIG. 9A, pad nitride layer 130 (see FIG. 8A) is removed leaving portions of polysilicon gates 180 with respective etch stop layers 190 extending above the surface of pad oxide layer 125. In one example, pad nitride layer 130 (see FIG. 8A) is removed using a wet or plasma etch process selective to etch silicon nitride over silicon dioxide. The portions of polysilicon gates 180 with respective etch stop layers 190 extending above the surface of pad oxide layer 125 will be used as mandrels in the formation of a self-aligned body contact as described infra.

Figure 10A:
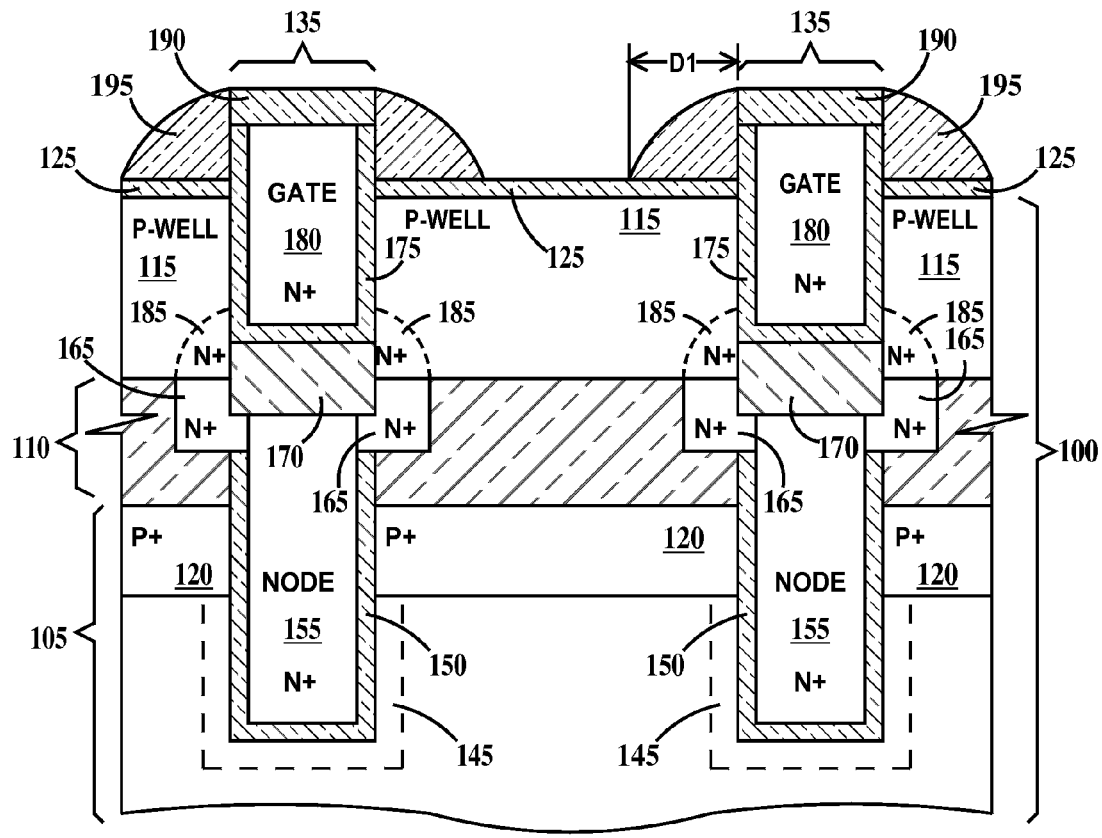

In FIG. 10A, sidewall spacers 195 are formed on the sidewalls of the mandrel formed of portions of polysilicon gates 180 with respective etch stop layers 190 extending above the surface of pad oxide layer 125. Sidewall spacers 195 have a width D1 measured along the surface of pad oxide layer 125. In one example, sidewall spacers 195 are formed by a conformal LPCVD of silicon nitride followed by an RIE selective to etch silicon nitride over silicon dioxide.

Figure 10B:
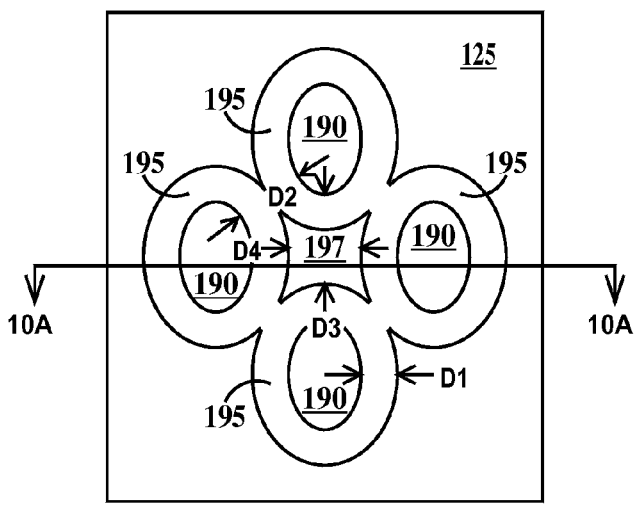

In FIG. 10B it is seen minimum distance between any pair of adjacent mandrels is D2. D1 is selected so that twice D1 is greater than D2 (2D1>D2) so that sidewall spacers 195 will merge at the point of minimum distance between any pair of adjacent mandrels forming a single integral structure. A distance D3 between opposite mandrels is chosen such that a space 197 having a minimum width D4 is defined by the merged sidewall spacers 195. D3=D4−2×D1.

Figure 11A:
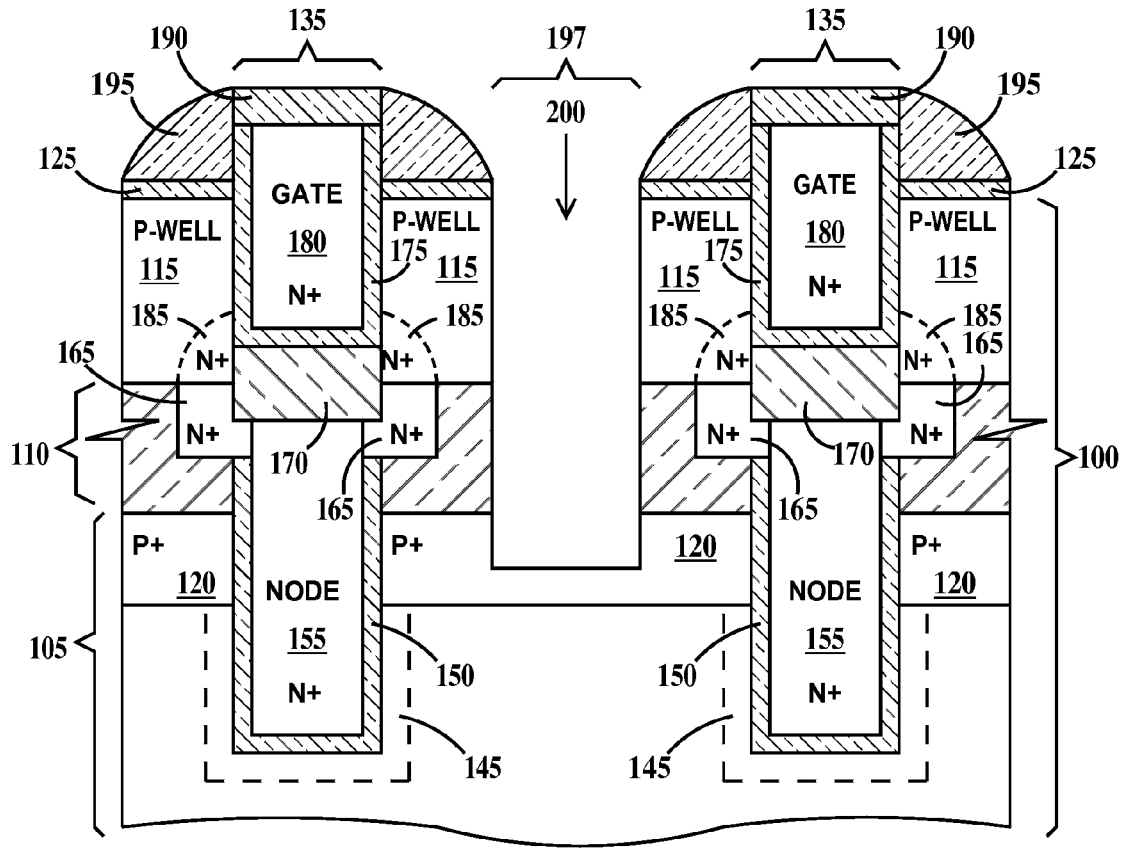
Figure 11B:
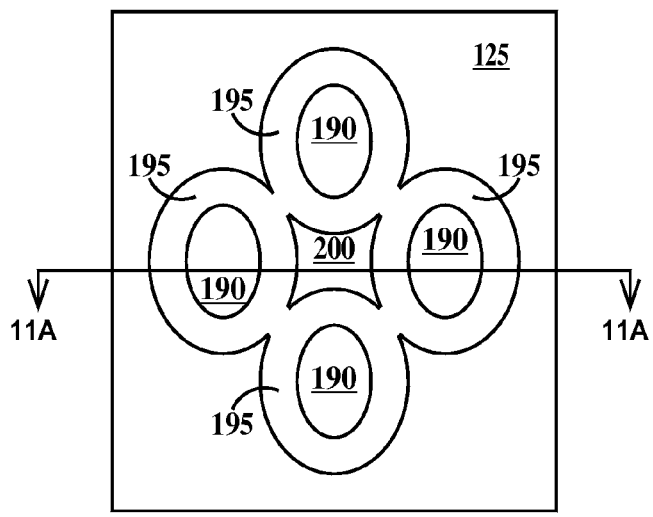

In FIGS. 11A and 11B, a trench 200 is formed in opening 197 between sidewall spacers 195. Trench 200 extends through pad oxide layer 125, upper silicon layer 115, and BOX layer 110 and into, but not through P-type silicon layer 120. In one example, trench 200 is formed by RIE or a combination of wet etching and RIE.

Figure 12A:
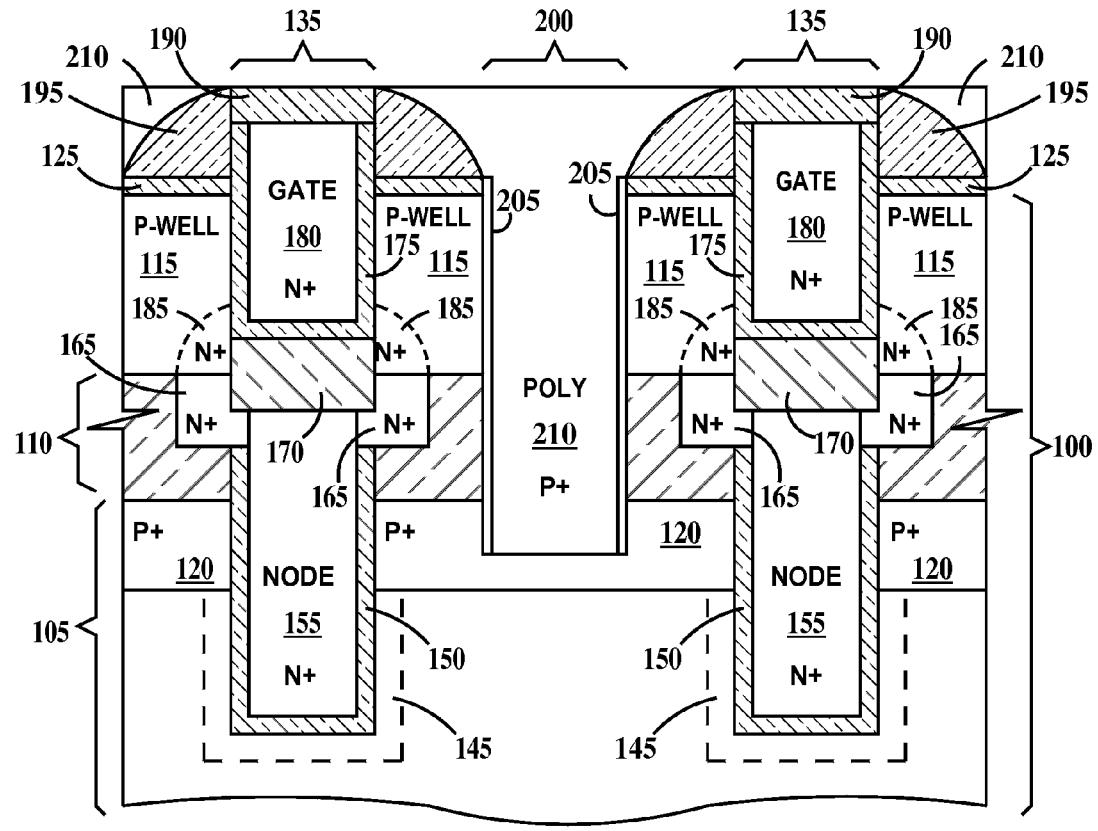
Figure 12B:
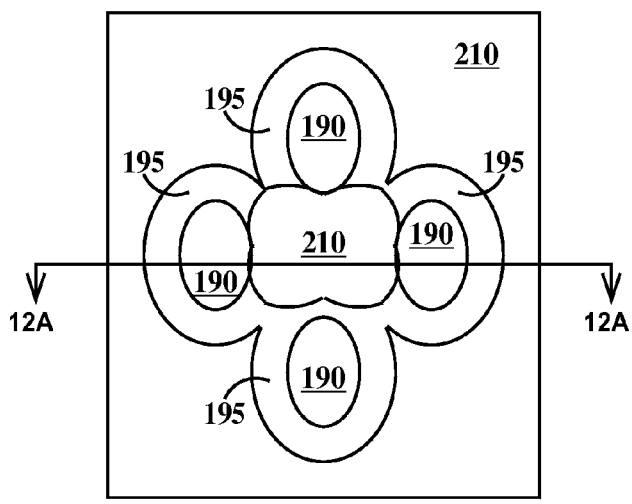

In FIG. 12A, an optional thin sidewall spacer 205 is formed on the sidewalls of trench 200 and trench 200 filled with a layer of polysilicon 210. In one example, polysilicon layer 210 is doped P-type with boron and sidewall spacer 205—a diffusion barrier to boron—comprises a silicon nitride or silicon carbide with a thickness ranging from 5 to 20 angstroms). Spacer 205 is thin enough so that carriers can tunnel through the spacer. Spacer 205 can be deposited by any suitable technique such as thermal nitridation, LPCVD, or ALD. In one example, polysilicon layer 210 is doped with indium, in which case sidewall spacer 205 is not required.

Figure 13A:
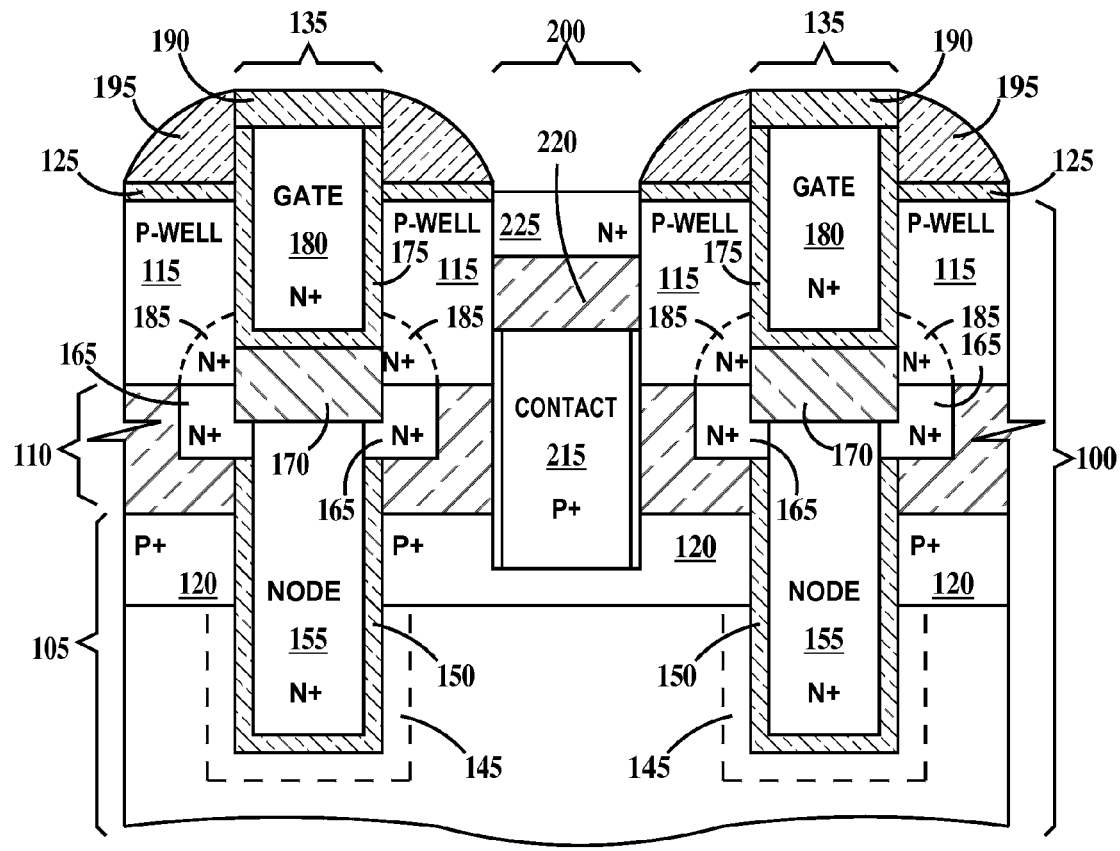
Figure 13B:
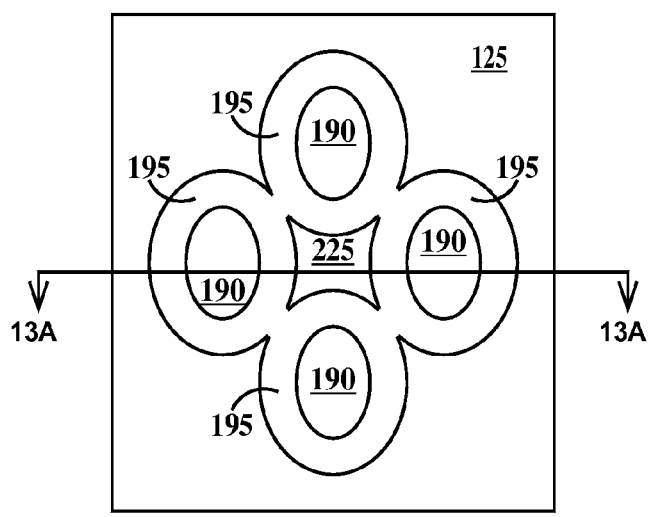

In FIG. 13A, upper portions of polysilicon layer 210 (see FIG. 12A) and optional sidewall spacer 205 are removed from an upper region of trench 200 to formed a buried body contact 215. Buried body contact 215 is self aligned gates 180 via spacers 195 and extends above BOX layer 110 into upper silicon layer 115 and below BOX layer 110 into P-type silicon layer 120, electrically connecting upper silicon layer 115 to P-type silicon layer 120. A single contact (not shown) to the P-type silicon layer 120 will enable a contact to the P-wells 115 of each NFETs. In one example, the upper portions of polysilicon layer 210 and optional sidewall spacer 205 are removed by RIE or a combination of wet etching and RIE. Then an insulating cap 220 is formed on top of buried body contact 215 and polysilicon strap 225 is formed on top of insulating cap 220. Insulating cap 220 does not extend to the top surface of substrate 100. In one example, insulating cap 220 is a high density plasma (HDP) oxide, which is deposited, and then wet etched back to expose upper silicon layer 115 in trench 200 above the insulating cap. In one example, polysilicon strap 225 is conformably grown from the exposed sidewalls of upper silicon layer 115. Polysilicon strap 225 may be doped N-type (as illustrated) or may be intrinsic.

Figure 14A:
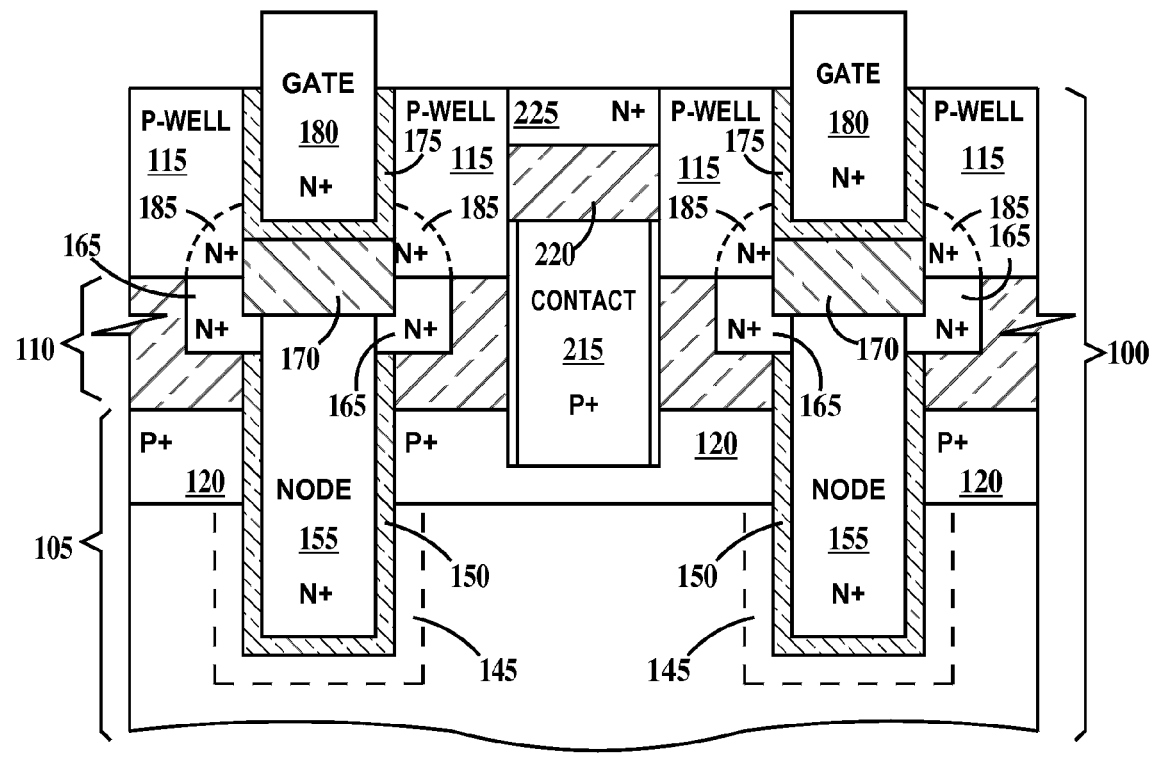
Figure 14B:
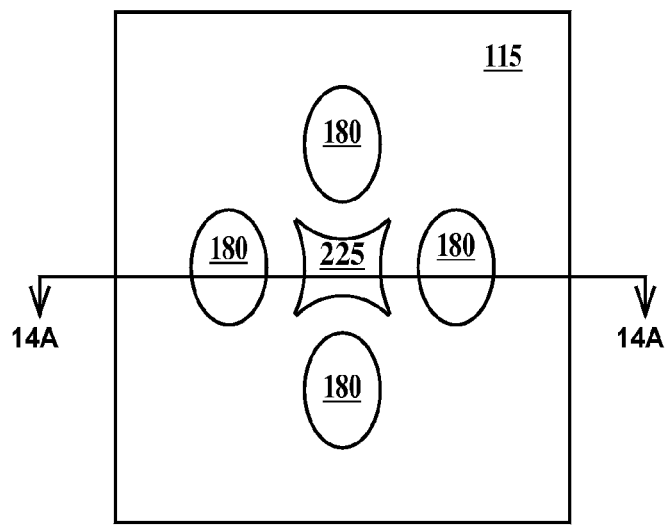

In FIG. 14A, spacers 215, etch stop layer 195 and pad oxide layer 125 (see FIG. 13A) are removed, in one example, by plasma etching, wet etching, or a combination of plasma and wet etching.

Figure 15A:
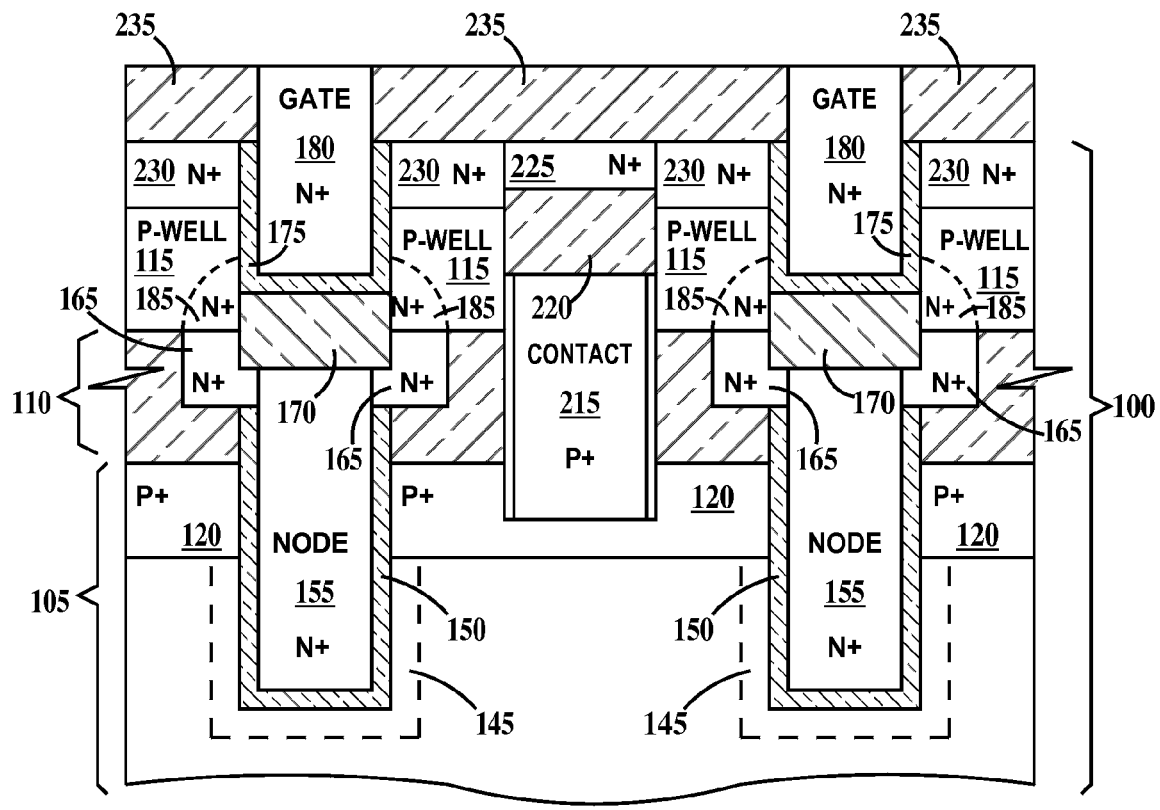
Figure 15B:
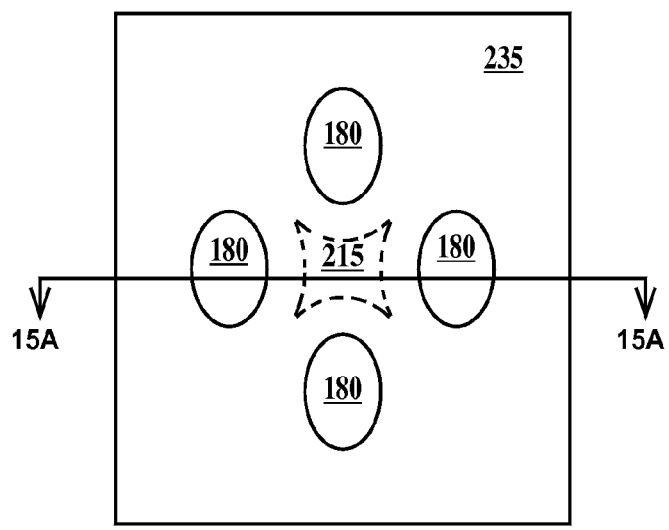

In FIG. 15A, an N-type ion implantation is performed into exposed upper silicon layer 115 (and polysilicon cap), forming N-type drains 230 above upper silicon layer 115. Drains 230 are the drains of the vertical NFETs. Then an insulating layer 235 is formed on top of drains 230 and polysilicon strap 225. In one example, insulating layer 235 is HDP oxide. Next, a CMP is performed, so that the top surface of gates 180 and insulating layer 235 are co-planer.

Figure 16A:
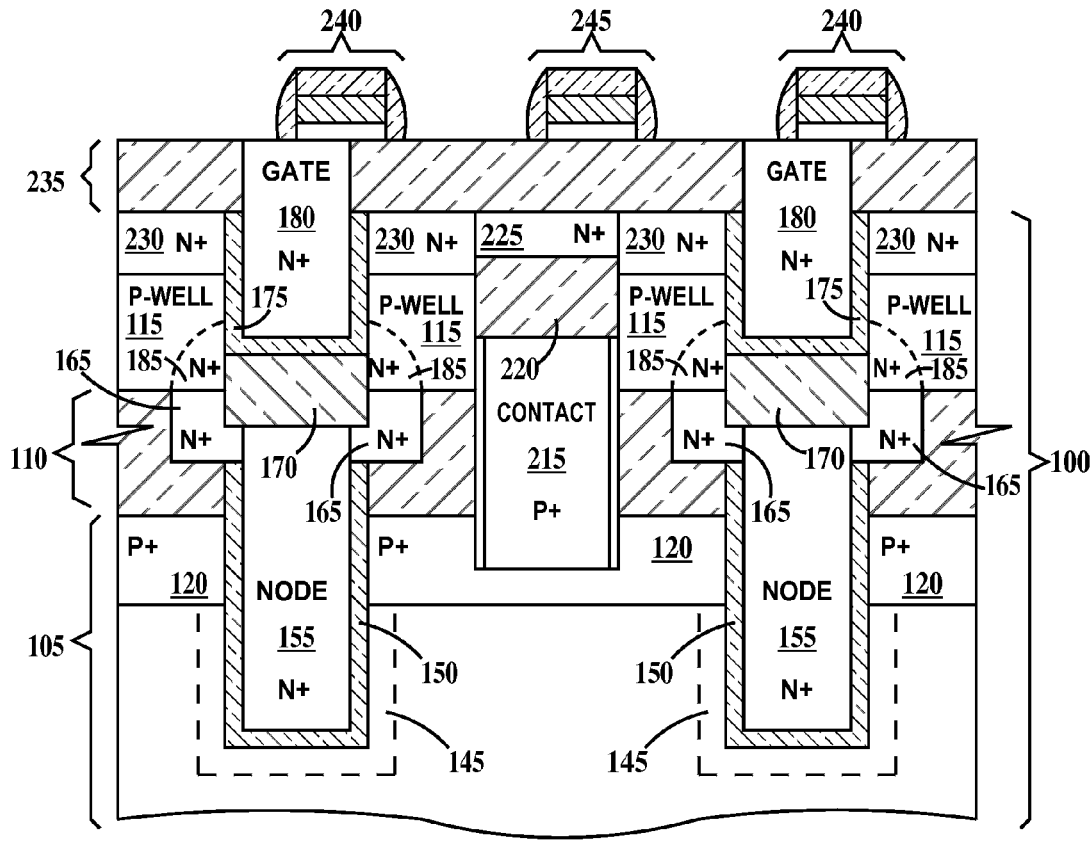

In FIG. 16A, wordlines 240 contacting gates 180 and a passing wordline 245 are formed on top of insulating layer 235. FIG. 16B illustrates a possible layout of wordlines 240 and passing wordline 245.

Figure 16C:
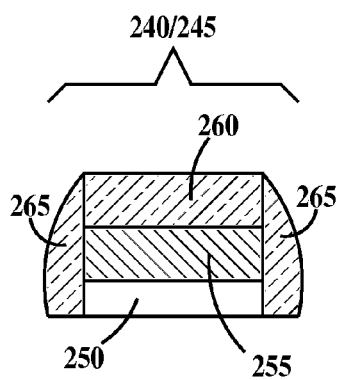
FIG. 16C is cross-section view through a DRAM wordline according to embodiments of the present invention.
Figure 16B:
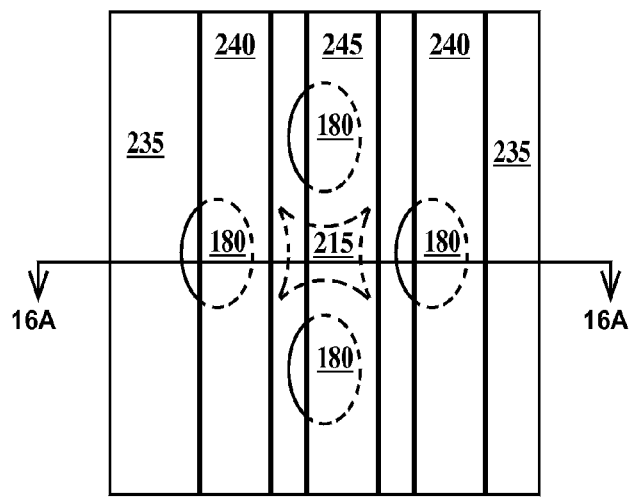

FIG. 16C is cross-section view through a DRAM wordline according to embodiments of the present invention. In FIG. 16C, wordlines 240/245 include a polysilicon layer 250, a tungsten/tungsten nitride layer 255 over the polysilicon layer, a silicon nitride cap 260 over the tungsten/tungsten nitride layer and silicon nitride spacers 265 on the sidewalls of the wordlines.

Figure 17A:
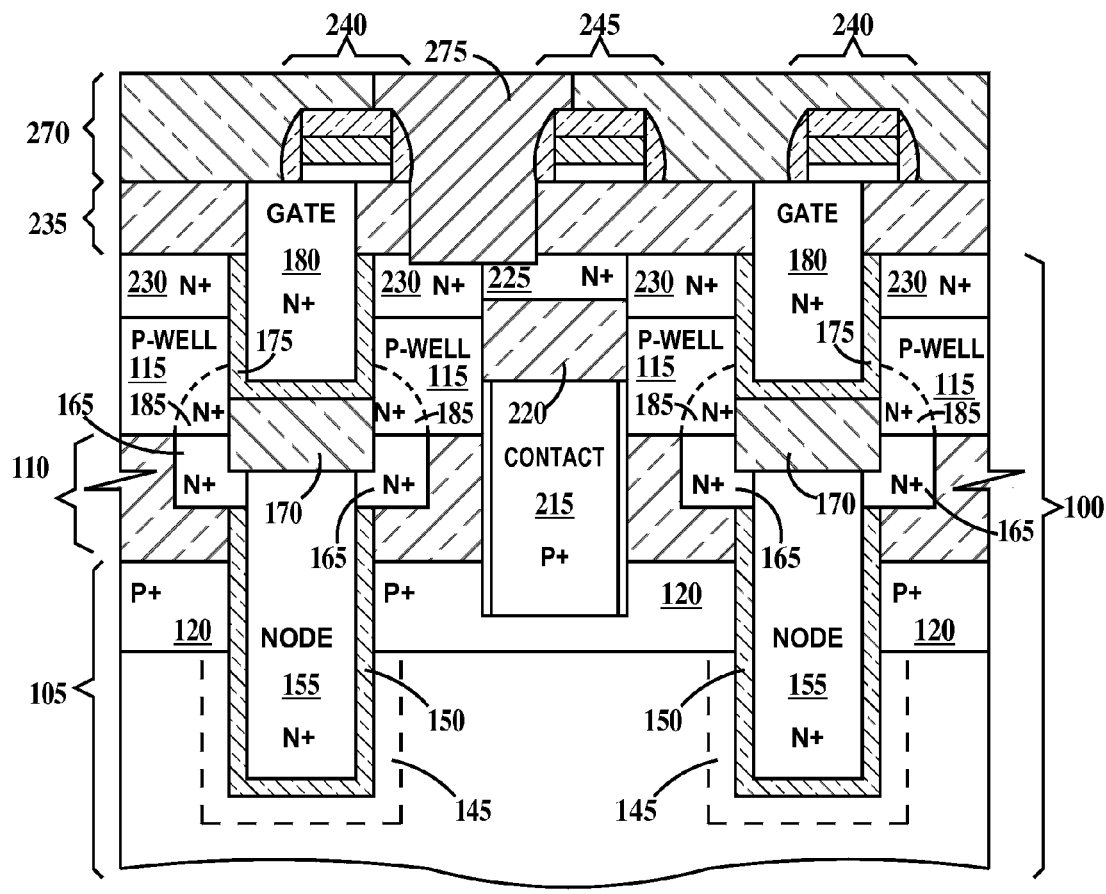
Figure 17B:
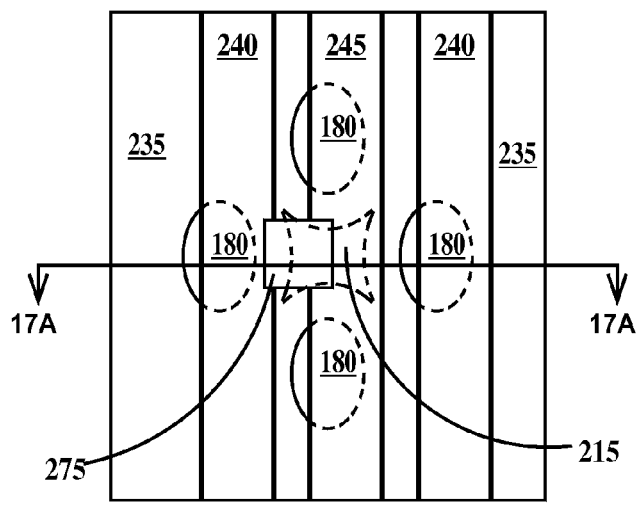

FIG. 17A is a cross-sectional view illustrating formation of a bitline contact and FIG. 17B is a top view illustrating the section line 17A-17A through which FIG. 17A is taken according to embodiments of the present invention. In FIG. 17A, a boro-phosphorous silicate glass (BPSG) layer 270 is formed on top of insulating layer 235, wordlines 240 and passing wordline 245. The BPSG layer 270 acts as an interconnect insulating layer as well as a contaminant gettering layer. A trench is etched through BPSG layer 270 and insulating layer 235 to drain 230 and polysilicon cap 225 and then filled with, in one example, doped polysilicon or a metal such as tungsten to form a bitline contact 275. Bitline contact 275 is self-aligned to wordlines 140/245 and one of drains 230 in at least one horizontal direction.

While four mandrel structures in a four cornered diamond pattern have illustrated in supra, other patterns may be used as illustrated in FIGS. 18A, 18B, 18C and 18D. In FIG. 18A, three mandrels 190/195 are arranged at the points of an equilateral triangle. In FIG. 18B, four mandrels 190/195 are arranged at the corners of a square. In FIG. 18C, five mandrels 190/195 are arranged at the corners of a pentagon. In FIG. 18D, six mandrels 190/195 are arranged at the corners of a hexagon. In FIGS. 18A, 18B, 18C and 18D, spacers 195 overlap and define a region that will be etched to form a trench 200 into which a self-aligned substrate contact may be formed. Any polygon may be used and the sides of the polygon need not be the same length, as differences in length can be compensated by differences in the horizontal dimensions of the mandrels.

FIG. 19 is a schematic circuit diagram illustrating the relationship between the physical structures of FIGS. 17A and 17B and a DRAM circuit. In FIG. 19, a single bitline is shared by two adjacent DRAM cells 280A and 280B. It can be seen that DRAM cells 280A and 280B share a common bitline 275 and a common buried body contact 215.

It should be noted that the embodiments of the present invention described herein with device regions being doped for a particular device type, i.e., a vertical NFET. The selected device type described herein is for example only and not intended as a limitation. A person of ordinary skill in the art would understand how to replace vertical NFETs with a vertical P-channel field effect transistor (vertical PFET) and N-type dopants with P-type dopants where appropriate without departing from the spirit or scope of the invention.

Thus, the embodiments of the present invention provide a structure for a contacted-body SOI vertical MOSFET and fabrication methods of contacted-body SOI vertical MOSFETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An electronic device, comprising:
    a semiconductor on insulator substrate, said substrate including a buried insulating layer separating said substrate into an upper semiconductor layer between a top surface of said buried insulating layer and said top surface of substrate and a lower semiconductor layer;
    at least three vertical field effect transistors (FETs), each of said three or more FETs having a body formed in said upper semiconductor layer, a gate extending from said top surface of said substrate, a first source/drain formed around said gate adjacent to said top surface of said upper semiconductor layer and a second source drain formed around said gate adjacent to said buried insulating layer; and
    a body contact formed in said substrate between said at least three vertical FETs, said body contact self-aligned to all of said gates of said at least three vertical FETs, said body contact extending above and below said buried insulating layer and electrically connecting said upper semiconductor layer to said lower semiconductor layer.

2. The device of claim 1, wherein said three or more vertical FETs are vertical NFETs.

3. The device of claim 1, wherein said three or more gates are arranged at the corners of a polygon.

4. The device of claim 1, further including:
    at least three corresponding trench capacitors formed in said lower semiconductor layer aligned under said vertical FETs, said trench capacitors each comprising an electrically conductive first plate surrounded by a dielectric layer and said dielectric layer surrounded by an electrically conductive second plate; and
    buried straps formed in said buried insulating layer and electrically connecting said second source/drain of corresponding vertical FETs to corresponding first plates of said trench capacitors.

5. The device of claim 4, further including:
    a bitline contact to said first source/drain of at least one of said at least three vertical FETs; and
    a wordline in physical and electrical contact with at least one gate of said at least three vertical FETs.

6. The device of claim 4, further including:
    a dielectric cap on top of said buried body contact, said dielectric cap extending from a top surface of said buried body contact toward but not to said top surface of said substrate;
    and an electrically conductive strap formed in said upper semiconductor layer on top of said dielectric cap and electrically connecting two first source/drains of different vertical FETs of said at least three vertical FETs, said source/drains extending from said top surface of said substrate deeper into said upper semiconductor layer than said strap.

7. The device of claim 1, further including a spacer on sidewalls of said contact trench.

8. The device of claim 7, wherein said spacer is silicon nitride or silicon carbide with a thickness ranging from 5 to 20 angstroms.

9. The device of claim 4, wherein said at least three vertical FETs includes four vertical FETs arranged over the corners of a four-sided diamond pattern.

10. The device of claim 4, wherein said first and second sources drains, said buried straps, said strap and said first plates are doped N-type and said upper semiconductor layer and said body contact are doped P-type.

* * * * *